United States Patent
Wendel et al.

(10) Patent No.: US 7,009,404 B2
(45) Date of Patent: Mar. 7, 2006

(54) METHOD AND DEVICE FOR TESTING THE ESD RESISTANCE OF A SEMICONDUCTOR COMPONENT

(75) Inventors: Martin Wendel, München (DE); Richard Owen, Regensburg (DE); Harald Gossner, Riemerling (DE); Wolfgang Stadler, München (DE); Philipp Riess, Wappinger, NY (US); Martin Streibl, Petershausen (DE); Kai Esmark, München (DE)

(73) Assignee: Infineon Technologies AG, Munich (DE)

( * ) Notice: Subject to any disclaimer, the term of this patent is extended or adjusted under 35 U.S.C. 154(b) by 38 days.

(21) Appl. No.: 10/160,740

(22) Filed: May 31, 2002

(65) Prior Publication Data

US 2003/0006776 A1    Jan. 9, 2003

(30) Foreign Application Priority Data

Jun. 1, 2001    (DE) ............................... 101 26 800

(51) Int. Cl.
*G01R 31/08*    (2006.01)
*G01R 27/08*    (2006.01)
(52) U.S. Cl. ..................... 324/525; 324/691; 324/693
(58) Field of Classification Search ................ 324/525, 324/765, 537; 438/14, 17, 18
See application file for complete search history.

(56) References Cited

U.S. PATENT DOCUMENTS

| | | | | |
|---|---|---|---|---|
| 4,703,551 A | * | 11/1987 | Szluk et al. ................. | 438/220 |
| 5,523,252 A | | 6/1996 | Saito ........................... | 437/151 |
| 5,557,195 A | * | 9/1996 | Schrimpf et al. .............. | 324/72 |
| 5,623,215 A | * | 4/1997 | Maytum ..................... | 324/765 |
| 5,786,700 A | * | 7/1998 | Jen et al. ..................... | 324/713 |
| 6,014,305 A | * | 1/2000 | Yu .............................. | 361/111 |
| 6,347,026 B1 | * | 2/2002 | Sung et al. ................... | 361/56 |

OTHER PUBLICATIONS

Ashton, R., "Test Structures and Modified Transmission Line Pulse System for the Study of Electrostatic Discharge", IEICE Trans. Electron., vol. E79-C, No. 2 (Feb. 1996) pp. 158-164.

* cited by examiner

*Primary Examiner*—Anjan Deb
*Assistant Examiner*—John Teresinski
(74) *Attorney, Agent, or Firm*—Peter F. Corless; Steven M. Jensen; Edwards Angell Palmer & Dodge

(57) ABSTRACT

To test the ESD resistance of a semiconductor component, for example of a NOS transistor, which can be used as a PSD protective element in a chip, a direct current characteristic of the semiconductor component is monitored and the ESD resistance of the respective semiconductor component is inferred depending on this. In particular, the direct current failure threshold of the semiconductor component at which an increased leakage current occurs in the non-conducting direction of the semiconductor component can be monitored in operation of the semiconductor component using an applied direct current and the ESD resistance of the semiconductor component inferred depending on a change in this direct current failure threshold.

6 Claims, 1 Drawing Sheet

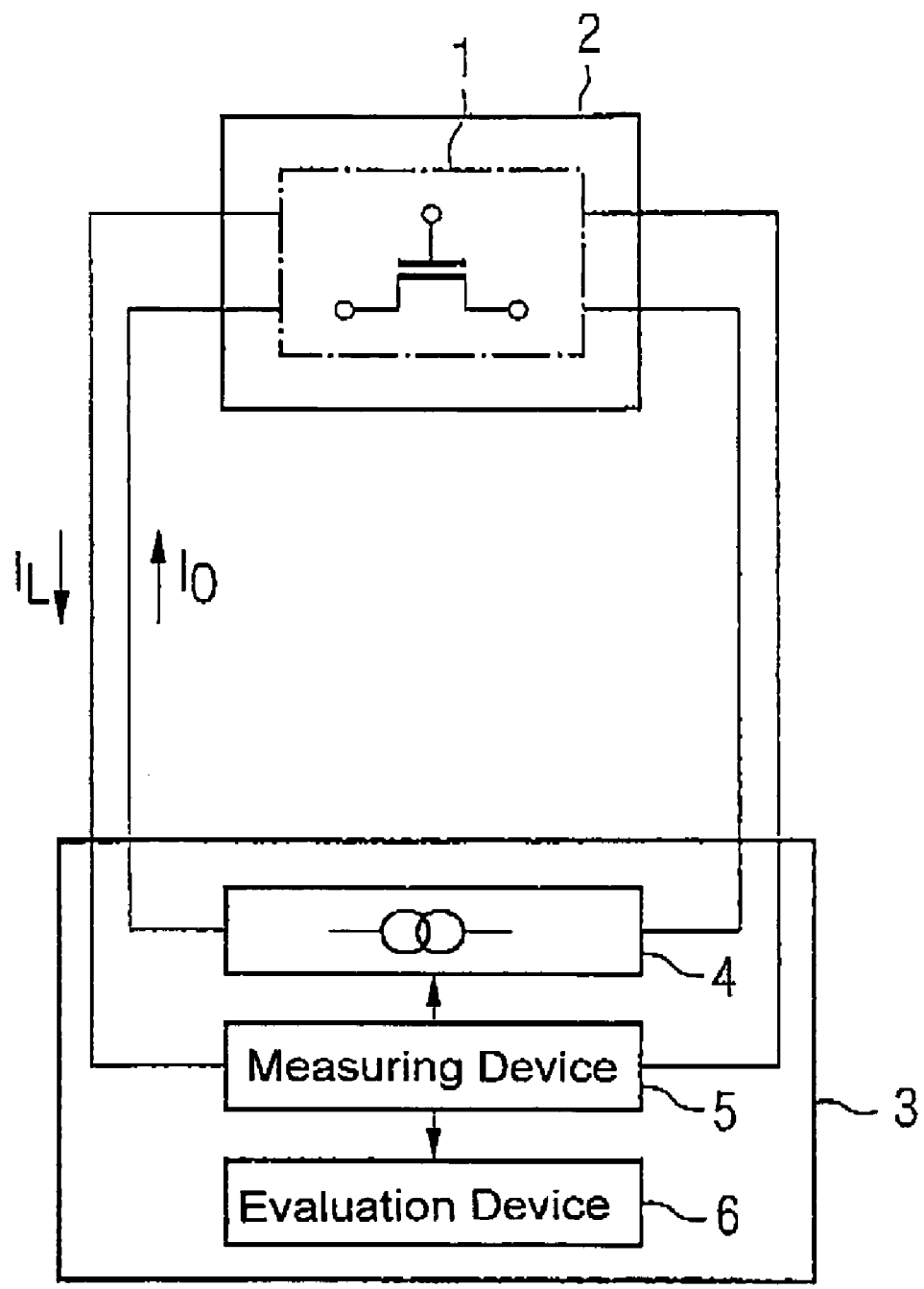

METHOD AND DEVICE FOR TESTING THE ESD RESISTANCE OF A SEMICONDUCTOR COMPONENT

BACKGROUND OF THE INVENTION

The present invention relates to a method and a device for testing the ESD resistance of a semiconductor component, in particular of an ESD protective element used in a chip to protect against electrostatic discharges.

Electrostatic discharges ("electrostatic discharge" or "electrostatic damage", ESD) pose a major problem in the field of integrated circuits. MOS and CMOS ("Complementary Metal Oxide Semiconductor") circuits in particular are very sensitive with regard to surges at their inputs. The static charge of a human being can amount to many kV, thus lying markedly above the critical gate oxide breakdown voltage of MOS components, so that the static charge of a human being alone can lead to the breakdown of the gate oxide of a MOS component.

Memory modules or chips must therefore be protected against electrostatic discharges (ESD) to prevent failure of the respective chip due to handling, i.e. due to picking up or touching, or in operation. Monitoring of the ESD properties of a chip during production is extremely important here, as the ESD properties can often deteriorate drastically even in the event of slight changes or adjustments in the technology.

Hitherto, suitably equipped special ESD testing laboratories have been required to carry out ESD measurements of this kind. In much ESD testing laboratories, an ESD protective element or active semiconductor component used in the semiconductor product to be tested and connected directly to a suitable pad is investigated with regard to its load capacity relative to ESD pulses. ESD pulses typically have a length of 1 ns–100 ns and a strength of several amperes and have a special pulse shape. ESD pulses of this kind can only be generated by special and therefore expensive testing devices, considerable know-how also being required to carry out such ESD measurements These ESD measurements have therefore only taken place up to now in suitably designed central departments or ESD testing laboratories, but not in the factory during a production or PCM ("Process Control Monitor") test.

As well as the problems described above, a further disadvantage consists in the fact that conventionally such ESD measurements are normally only initiated following the failure of a relevant chip product for the customer, owing to the outlay associated with these. Actual monitoring of the process at regular intervals does not take place. In addition, the ESD testing devices used in such ESD testing laboratories are not designed for a high throughput, so that statistical reports regarding the occurrence of faults owing to electrostatic discharges are only obtainable to a very limited degree and only with a great time loss. It thus takes a very long time after a fault has been established to restore the ESD resistance of the manufacturing processes of suitable chips.

SUMMARY OF THE INVENTION

The object of the present invention therefore is to provide a method and a device for testing the ESD resistance of a semiconductor component, using which the ESD resistance can be tested in particular in the simplest manner possible even during the production process.

This object is achieved according to the invention by a method and a device for testing the ESD resistance of a semiconductor component. Also disclosed are preferred and advantageous embodiments of the present invention.

The present invention is based on the realization that changes in the ESD resistance are generally also reflected in special aspects of the direct current characteristic of the respective semiconductor component. Direct current here is taken to mean all currents with pulse lengths that are many times greater than ESD pulses (with a pulse length of approx. 1 ns–100 ns), i.e. with pulse lengths in particular greater than 1 $\mu$s. Investigations have shown that a reduced resistance of a MOS transistor, for example, when loaded with short ESD pulses is accompanied by a reduced resistance to direct current loading, i.e. the direct current characteristic or the direct current characteristic curve of the respective component correlates to its ESD resistance.

To test the ESD resistance of a semiconductor component, it is therefore proposed according to the invention to monitor the direct current characteristic of this component and to infer the ESD resistance of the relevant component depending on this.

To determine the ESD resistance, it is proposed in particular to ascertain the direct current failure threshold of the respective semiconductor component that is present when the component is operated using an applied direct current, it being possible to assume in the event of a change in this direct current failure threshold that the ESD performance, i.e. ESD resistance, is also impaired. In this case the direct current failure threshold is defined as the value of the direct current applied at which the respective semiconductor component has an increased leakage current in the non-conducting direction compared with a set threshold value.

One particular advantage connected with the present invention consists in the fact that the direct current measurement proposed according to the invention for testing the ESD resistance can also be carried out in the factory, i.e. during production, using standard current sources available there and without any particular specialist knowledge. If the ESD protective elements of the chips that are to be tested with regard to their ESD resistance are dimensioned to a gate width of approx. 2–20 $\mu$m in CMOS technologies, the direct current failure threshold can be set to a value that is attained with standard PCM testers (typically 0.1A). Due to this, measurement of the ESD or direct current resistance can be implemented even in conventional standard PCM programmes and up to 100% monitoring of all wafers produced can be achieved virtually without any additional expenditure.

In addition, it is advantageous that excellent statistical reports can be obtained regarding the ESD fault frequency using simple means. Even ESD failures that only occur with a low level of probability are thus detected.

Dramatically accelerated learning cycles with regard to ESD problems constitute a further decisive improvement compared with the conventional procedure described at the beginning. Whereas according to the prior art all ESD measurements have to be carried out in special ESD testing laboratories with a low throughput, the present invention makes it possible for all the information required to be extracted henceforth extremely quickly on the spot from an inspection test that is carried out anyway and thus for it to be able to be incorporated immediately into the manufacturing process.

The present invention is explained in greater detail below with reference to a preferred embodiment and to the enclosed drawing.

BRIEF DESCRIPTION OF THE DRAWING

The sole diagram shows a strongly simplified diagrammatic representation of a device for testing the ESD resistance of a semiconductor component according to a preferred embodiment of the present invention.

DETAILED DESCRIPTION OF THE

The basis of the present invention is the realization that changes in the ESD resistance of a semiconductor component are generally reflected also in special aspects of the direct current characteristic of this semiconductor component.

The diagram shows a MOS transistor as an example, a similar form of which (e.g. varied in size) is used as an ESD protective element 1 in a chip 2. The ESD resistance of this ESD protective element should be able to be tested if possible during production of the chip 2, i.e. while still in the factory. This is facilitated with the aid of the present invention in that the direct current characteristic of the ESD protective element 1 is monitored and the ESD resistance of this ESD protective element 1 and semiconductor component is inferred depending on this.

To test the ESD resistance, a testing device 3 is provided, which has a current source 4 for applying direct current $I_o$ to the ESD protective element 1. Furthermore, the testing device 3 has a measuring device 5, which measures a direct current characteristic of the ESD protective element 1 that appears as a result of this. The measuring device 5 controls the current source 4 here in particular such that the direct current $I_o$ applied is increased continuously until a certain failure threshold can be determined by the measuring device 5 with reference to the direct current load. Direct current failure is assumed here in particular if the ESD protective element 1 has an increased leakage current $I_L$ in the non-conducting direction. By evaluating the leakage current of the ESD protective element 1 in the non-conducting direction, an evaluation device 6 contained in the testing device 3 can infer the momentary direct current failure threshold of the ESD protective element 1. By comparing the determined direct current failure threshold of the ESD protective element 1 with the value of the direct current failure threshold of a fault-free ESD protective element 1, the evaluation device 6 can now establish whether any change, i.e. any deterioration, is present in the direct current failure threshold of the ESD protective element, it being possible to assume in this case that the ESD performance, i.e. the ESD resistance, of the ESD protective element 1 is also impaired.

To determine the ESD resistance of the ESD protective element 1, it is not absolutely necessary for the direct current failure threshold of the ESD protective element 1 tested to be determined as described above. Instead of this, a previously defined direct current $I_o$ can also be applied to the ESD protective element 1 to be tested by the testing device 3, no damage to the relevant semiconductor component normally occurring with this direct current $I_o$ if the component has the required ESD resistance. If the measuring device 5 and evaluation device 6 now detect a leakage current $I_L$ of the ESD protective element 1 in the non-conducting direction that is increased compared with a set threshold value at this direct current value $I_o$, the evaluation device 6 infers accordingly that the ESD resistance of the ESD protective element 1 is also impaired.

The method described above is particularly advantageous if the ESD protective element used in a chip 2 is scaled to a gate width of approx. 2–20 μm and used on the wafer at a point that is favourable for monitoring purposes, e.g. in the PCM framework ("Process Control Monitor"), so that the direct current failure threshold to be monitored can be set to a value that can be attained with standard PCM testers. The direct current failure threshold can be adapted in this way to existing testing devices, i.e. the present invention can even be implemented in standard PCM programmes, so that 100% monitoring of all chips 2 or wafers produced can be achieved virtually without any additional expenditure.

What is claimed is:

1. Method for testing the ESD resistance of a semiconductor component, comprising steps of:
   applying a direct current ($I_o$) to the semiconductor component;
   monitoring a direct current characteristic of the semiconductor component to detect a direct current failure threshold of the semiconductor component when operated using the applied direct current; and
   inferring the ESD resistance of the semiconductor component from the direct current failure threshold,
   wherein the direct current failure threshold is defined as the direct current ($I_o$) at which the semiconductor component has a leakage current ($I_L$) in the non-conducting direction that is increased compared with a predetermined threshold value, and
   the direct current failure threshold of the semiconductor component is determined in that the applied direct current ($I_o$) with which the semiconductor component is operated is increased until the leakage current ($I_L$) of the semiconductor component (1) has exceeded the set threshold value in the non-conducting direction.

2. Method according to claim 1, wherein the method is used for testing the ESD resistance of a MOS component with a gate width of 2–20 μm.

3. Method according to claim 2, wherein the method is used for testing the ESD resistance of a MOS component used as an ESD protective element in a semiconductor chip (2) formed in CMOS technology.

4. Method according to claim 1, wherein to monitor the direct current characteristic, the semiconductor component is operated using a current with a pulse greater than 1 μs.

5. Device for testing the ESD resistance of a semiconductor component, the semiconductor component being operated using an applied direct current ($I_o$), comprising:
   a measuring device for measuring a direct current characteristic of the semiconductor component, the measuring device detecting a direct current failure threshold of the semiconductor component when operated using the applied direct current; and
   an evaluation device for assessing the ESD resistance of the semiconductor component depending on the direct current characteristic of the semiconductor component measured by the measuring device,
   wherein the evaluation device is designed such that it infers deficient ESD resistance of the semiconductor component if a direct current failure threshold that is reduced compared with a predetermined direct current failure threshold has been detected by the measuring device.

6. Device according to claim 5, wherein the measuring device measures the direct current failure threshold of the semiconductor component operated using the applied direct current ($I_o$) and detects as the direct current failure threshold that direct current value at which a leakage current ($I_L$) that is increased compared with a set threshold value occurs at the semiconductor component (1) in the non-conducting direction.

* * * * *